United States Patent
Kim (10) Patent No.: US 7,830,489 B2
(45) Date of Patent: Nov. 9, 2010

(54) FLEXIBLE CIRCUIT BOARD, DISPLAY UNIT HAVING THE SAME AND DISPLAY DEVICE HAVING THE SAME

(75) Inventor: Ock-Jin Kim, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 902 days.

(21) Appl. No.: 11/652,818

(22) Filed: Jan. 12, 2007

(65) Prior Publication Data

US 2007/0167036 A1    Jul. 19, 2007

(30) Foreign Application Priority Data

Jan. 13, 2006    (KR) .................. 10-2006-0003803

(51) Int. Cl.
*G02F 1/1345*    (2006.01)
*H05K 1/00*    (2006.01)
(52) U.S. Cl. ..................... 349/150; 361/749
(58) Field of Classification Search ................ 349/150; 361/749
See application file for complete search history.

(56) References Cited

U.S. PATENT DOCUMENTS

| 4,832,455 A | * | 5/1989 | Takeno et al. ................ 349/149 |
| 5,670,994 A | * | 9/1997 | Kawaguchi et al. .......... 345/206 |
| 2003/0080953 A1 | * | 5/2003 | Ting .......................... 345/206 |

FOREIGN PATENT DOCUMENTS

CN    1475842 A    2/2004

* cited by examiner

*Primary Examiner*—Michael H Caley
(74) *Attorney, Agent, or Firm*—Cantor Colburn LLP (57) ABSTRACT

A flexible circuit board includes a base substrate, a driving chip, an input transmission line, an output transmission line and a connecting transmission line. The driving chip is on a surface of the base substrate. The input transmission line is on the surface of the base substrate and electrically connected to an input terminal of the driving chip. The output transmission line is on the surface of the base substrate and electrically connected to an output terminal of the driving chip. The input transmission line is electrically connected to the output transmission line through the connecting transmission line.

11 Claims, 6 Drawing Sheets

FLEXIBLE CIRCUIT BOARD, DISPLAY UNIT HAVING THE SAME AND DISPLAY DEVICE HAVING THE SAME

The present application claims priority to Korean Patent Application No. 2006-03803, filed on Jan. 13, 2006, and all the benefits accruing therefrom under 35 U.S.C. §119, the contents of which are hereby incorporated herein by reference in its entirety.

BACKGROUND OF THE INVENTION

1. Field of the Invention

The present invention relates to a flexible circuit board, a display unit having the flexible circuit board and a display device having the flexible circuit board. More particularly, the present invention relates to a flexible circuit board capable of decreasing line resistance, a display unit having the flexible circuit board and a display device having the flexible circuit board.

2. Description of the Related Art

A liquid crystal display ("LCD") device includes a display unit and a backlight assembly. The display unit displays images using a light transmittance of liquid crystals. The backlight assembly is under the display unit to supply the display unit with light.

The display unit includes a first substrate, a second substrate, a liquid crystal layer, a printed circuit board and a flexible circuit board. The first substrate includes a thin film transistor. The second substrate includes a color filter. The liquid crystal layer is interposed between the first and second substrates. The printed circuit board generates a control signal to drive the thin film transistor. The first substrate is electrically connected to the printed circuit board through the flexible circuit board and the flexible circuit board transmits the control signal to the first substrate.

The printed circuit board includes a data printed circuit board and a gate printed circuit board. The flexible circuit board includes a data flexible circuit board and a gate flexible circuit board. The data printed circuit board is electrically connected to a data line of the first substrate through the data flexible circuit board. The gate printed circuit board is electrically connected to a gate line of the first substrate through the gate flexible circuit board.

In order to decrease a size of the LCD device, an LCD device without the gate printed circuit board has been devised. A data printed circuit board of the LCD device without the gate printed circuit board controls the data flexible circuit board and the gate flexible circuit board.

However, internal lines of the driving chip have irregular shape and high resistance so that the gate control signal is delayed. When the gate control signal is delayed, the gate signal is distorted so that image display quality of the LCD device is deteriorated.

BRIEF SUMMARY OF THE INVENTION

An exemplary embodiment of the present invention provides a flexible circuit board capable of decreasing wiring resistance.

An exemplary embodiment of the present invention also provides a display unit having the above-mentioned flexible circuit board.

An exemplary embodiment of the present invention also provides a display device having the above-mentioned flexible circuit board.

An exemplary embodiment of a flexible circuit board includes a base substrate, a driving chip, an input transmission line, an output transmission line and a connecting transmission line.

The driving chip is on a first surface of the base substrate. The input transmission line is on the first surface of the base substrate and electrically connected to an input terminal of the driving chip. The output transmission line is on the first surface of the base substrate and electrically connected to an output terminal of the driving chip. The input transmission line is electrically connected to the output transmission line through the connecting transmission line, and is disposed in a region corresponding to the driving chip.

An exemplary embodiment of a display unit includes a display panel, a printed circuit board, a data flexible circuit board and a gate flexible circuit board.

The display panel displays images. The printed circuit board generates a data control signal for displaying the image and a gate control signal. The data flexible circuit board is electrically connected to an end portion of the display panel and the printed circuit board and transmits the data control signal and the gate control signal to the display panel. The gate flexible circuit board is electrically connected to another end portion of the display panel. The gate flexible circuit board includes a base substrate, a driving chip on a surface of the base substrate and receiving the gate control signal from the display panel and a connecting transmission line in a region corresponding to the driving chip and transmitting the gate control signal.

An exemplary embodiment of a display device includes a display unit and a backlight assembly. The display unit displays images based on light. The backlight assembly provides the display unit with the light.

The display unit includes a display panel, a printed circuit board, a data flexible circuit board and a gate flexible circuit board. The display panel displays the images. The printed circuit board generates a data control signal for displaying the images and a gate control signal. The data flexible circuit board is electrically connected to an end portion of the display panel and the printed circuit board and transmitting the data control signal and the gate control signal to the display panel.

The gate flexible circuit board is electrically connected to another end portion of the display panel. The gate flexible circuit board includes a base substrate, a driving chip on a surface of the base substrate and receiving the gate control signal from the display panel and a connecting transmission line in a region corresponding to the driving chip and transmitting the gate control signal.

In an exemplary embodiment, the connecting transmission line that has lower resistance than an internal line of the driving chip is formed in a region corresponding to the driving chip-region so that the gate control signal is transmitted through the connecting transmission line. Therefore, a resistance of the gate flexible circuit board that transmits the gate control signal is decreased.

BRIEF DESCRIPTION OF THE DRAWINGS

The above and other advantages of the present invention will become more apparent by describing in detail example embodiments thereof with reference to the accompanying drawings, in which.

DETAILED DESCRIPTION OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "under," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" other elements or features would then be oriented "above" the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

Figure 1:
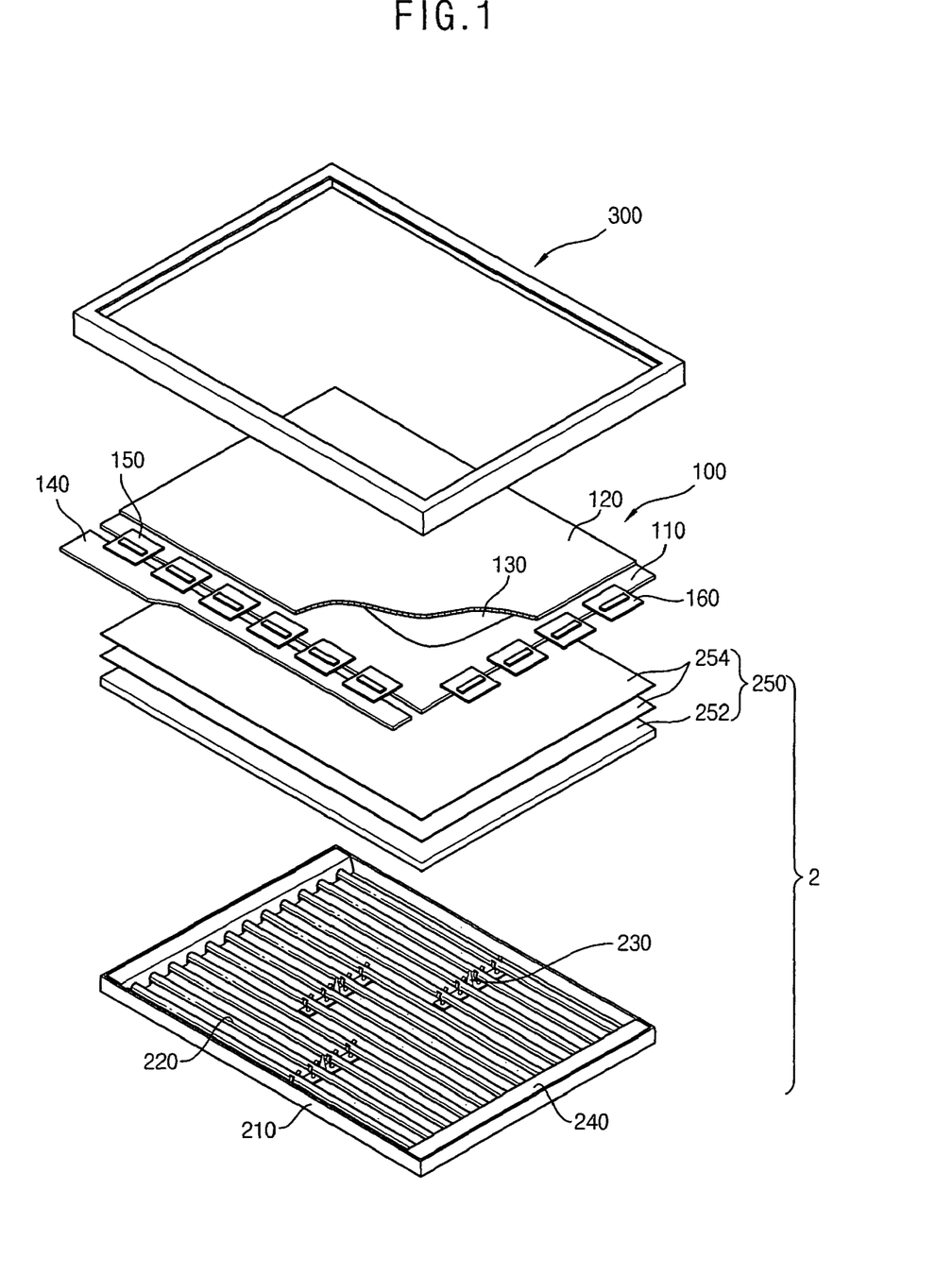
FIG. 1 is an exploded perspective view illustrating an exemplary embodiment of a display device in accordance with the present invention.

FIG. 1 is an exploded perspective view illustrating an exemplary embodiment of a display device in accordance with one embodiment of the present invention.

Referring to FIG. 1, the display device includes a display unit 100, a backlight assembly 200 and a top chassis 300. The display unit 100 displays images based on light. The backlight assembly 200 supplies the display unit 100 with light. The top chassis 300 is combined with the backlight assembly 200 to fix the display unit 100.

The display unit 100 includes a first substrate 110, a second substrate 120, a liquid crystal layer 130, a printed circuit board 140, a data flexible circuit board 150 and a gate flexible circuit board 160. Hereinafter, the display unit 100 is firstly described, and other elements will be described.

The first substrate 110 includes a plurality of pixel electrodes, a plurality of thin film transistors and a plurality of signal lines. The pixel electrodes are arranged in a matrix shape. Each of the thin film transistors applies a driving voltage to each of the pixel electrodes. The signal lines are electrically connected to the thin film transistors.

The second substrate 120 faces the first substrate 110. The second substrate 120 includes a common electrode and a plurality of color filters. The common electrode is on a substantially entire surface of the second substrate 120 and includes a transparent conductive material. The color filters face the pixel electrodes. The color filters may include a red color filter, a green color filter and a blue color filter.

The liquid crystal layer 130 includes liquid crystals interposed between the first and second substrates 110 and 120. The liquid crystals vary in arrangement in response to an electric field applied thereto and a light transmittance of the liquid crystal layer 130 is changed. Thus, the light passes through the liquid crystal layer 130 and the color filters to display images.

The printed circuit board 140 faces an end portion of the first substrate 110. The printed circuit board 140 includes a driving circuit that processes an image signal. The driving circuit changes the image signal that is provided from an exterior to printed circuit board 140 into a data control signal for displaying images and a gate control signal.

The printed circuit board 140 is electrically connected to an end portion of the first substrate 110 through the data flexible circuit board 150. The data flexible circuit board 150 applies the data control signal and the gate control signal to the first substrate 110.

The gate flexible circuit board 160 is on another end portion of the first substrate 110, such as on a side of the first substrate 110 adjacent to a side where the printed circuit board 140 is disposed. The gate flexible circuit board 160 may be substantially perpendicular to the data flexible circuit board 150 with respect to the first substrate 110. The gate flexible circuit board 160 is controlled by the gate control signal that is transmitted to the first substrate 110.

The backlight assembly 200 is under the display unit 100, and includes a receiving container 210, a lamp 220, a lamp supporter 230, a side mold 240 and an optical member 250.

The receiving container 210 includes a bottom plate and a sidewall, and receives the lamp 220, the lamp supporter 230, the side mold 240 and the optical member 250.

The lamp 220 generates the light. In one exemplary embodiment, the lamp 220 includes a cold cathode fluorescent lamp ("CCFL") having low heat and long lifetime. Alternatively, the lamp 220 may include an external electrode fluorescent lamp (EEFL), a light emitting diode (LED), etc. In exemplary embodiments, the lamp 220 may have a rod shape and/or a plurality of lamps 220 may be aligned in the receiving container 210.

The lamp supporter 230 is received in the receiving container 210 to support the lamp 220 so that the lamp 220 is spaced apart from the bottom plate of the receiving container 210.

As in the illustrated exemplary embodiment, two side molds 240 opposite to each other are received in the receiving container 210 to cover both sides (or ends) of the lamp 220.

The optical member 250 is disposed on the lamp 220 to improve optical characteristics of the light generated from the lamp 220. In one exemplary embodiment, the optical member 250 may include, but is not limited to, a diffusion plate 252 and at least one prism sheet 254. The diffusion plate 252 is on the lamp 220 to diffuse the light generated from the lamp 220. The prism sheet 254 is on the diffusion plate 252 to increase a luminance of the light having passed through the diffusion plate 252 when viewed on a plane.

In FIG. 1, the backlight assembly 200 is a direct illumination type and the lamps 220 are aligned under the display unit 100. In an alternative exemplary embodiment, the backlight assembly may be an edge illumination type, and may include a light guiding plate and a light source on a side surface of the light guiding plate. Alternatively, the backlight assembly 200 may further include a mold frame (not shown) for supporting the optical member 250.

The top chassis 300 surrounds sides of the display unit 100 and is combined with the sidewall of the receiving container 210 to fix the display unit 100 to an upper surface of the backlight assembly 200. The top chassis 300 protects the display unit 100, that may be brittle, from externally provided impact and vibration. The top chassis 300 reduces or effectively prevents separation of the display unit 100 from the receiving container 210.

Figure 2:
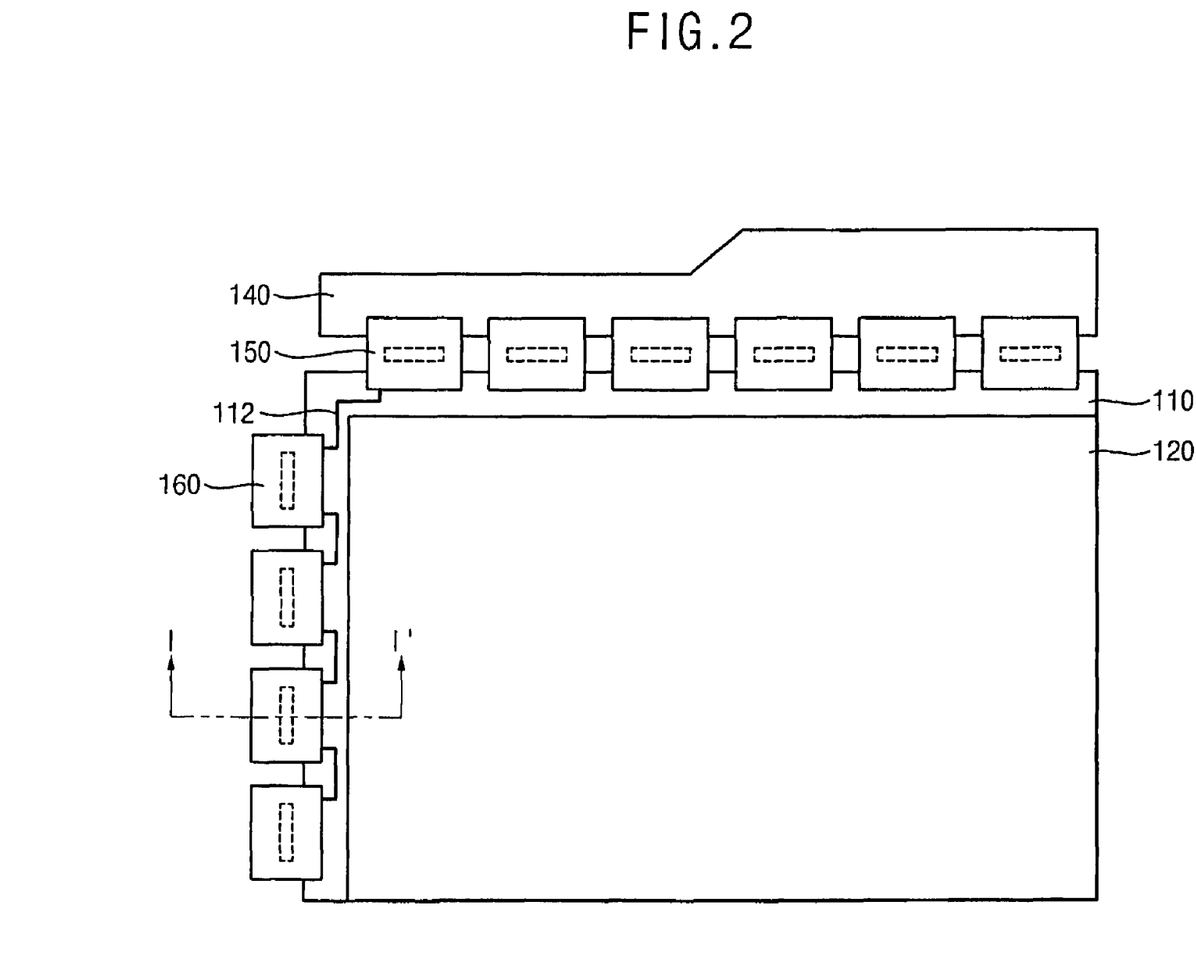
FIG. 2 is a plan view illustrating an exemplary embodiment of a display unit of the display device shown in FIG. 1.

FIG. 2 is a plan view illustrating an exemplary embodiment of a display unit of the display device shown in FIG. 1.

Referring to FIG. 2, the display unit 100 includes a first substrate 110, a second substrate 120, a liquid crystal layer 130, a printed circuit board 140, a data flexible circuit board 150 and a gate flexible circuit board 160.

The first substrate 110 includes a plurality of data lines (not shown) and a plurality of gate lines (not shown). A plurality of pixels is defined by the data and gate lines crossing each other. A pixel electrode (not shown) and a thin film transistor (not shown) are formed in each of the pixels. A source electrode of each of the thin film transistors is electrically connected to one of the data lines. A gate electrode of each of the thin film transistors is electrically connected to one of the gate lines. A drain electrode of each of the thin film transistors is electrically connected to each of the pixel electrodes.

The second substrate 120 faces the first substrate 110 and includes a common electrode and a color filter.

The liquid crystal layer 130 includes liquid crystals interposed between the first and second substrates 110 and 120. The liquid crystals vary in arrangement in response to an electric field applied between the pixel electrodes and the common electrode.

The printed circuit board 140 faces an end portion of the first substrate 110. The printed circuit board 140 changes an image signal into a data control signal for displaying images and a gate control signal.

The printed circuit board 140 is electrically connected to an end portion of the first substrate 110 through the data flexible circuit board 150. In one exemplary embodiment, output terminals of the printed circuit board 140 are electrically connected to data lines of the first substrate 110 through the data flexible circuit board 150. The data flexible circuit board 150 includes a data driving chip that generates a data signal based on the data control signal. The data signal that is generated from the data driving chip is applied to the data lines.

In FIG. 2, a plurality of data flexible circuit boards 150 may be aligned along the end portion of the first substrate 110. A leftmost data flexible circuit board 150 of the data flexible circuit boards 150 may also transmit the gate control signal to the first substrate 110. The leftmost data flexible circuit board 150 may include a transmitting line (not shown) for transmitting the gate control signal to the first substrate 110. The first substrate 110 may further include a gate control line 112 that transmits the gate control signal. The leftmost data flexible circuit board 150 may transmit the gate control signal to the gate control line 112 of the first substrate 110.

In FIG. 2, a plurality of gate flexible circuit boards 160 may be aligned along another end portion of the first substrate 110, which is substantially perpendicular to the data flexible circuit boards 150. As in the illustrated exemplary embodiment, first, second, third and fourth gate flexible circuit boards 160 are aligned along the another end portion of the first substrate 110, in sequence.

The first gate flexible circuit board 160 is electrically connected to the gate control line 112 of the first substrate 110 and a portion of the gate lines. The first gate flexible circuit board 160 receives the gate control signal to generate a portion of the gate signals based on the gate control signal. The portion of the gate signals is applied to the portion of the gate lines to control a portion of the thin film transistors.

The gate control signal that is applied to the first gate flexible circuit board 160 is applied to the gate control line 112 of the first substrate 110, and is applied to the second gate flexible circuit board 160 through the gate control line 112. The second gate flexible circuit board 160 generates a portion of the gate signals based on the gate control signal, and the portion of the gate signals are applied to a portion of the gate lines to control a portion of the thin film transistors.

The gate control signal that is applied to the second gate flexible circuit board 160 is applied to the gate control line 112 of the first substrate 110, and is applied to the third gate flexible circuit board 160 through the gate control line 112. The third gate flexible circuit board 160 generates a portion of the gate signals based on the gate control signal, and the portion of the gate signals are applied to a portion of the gate lines to control a portion of the thin film transistors.

The gate control signal that is applied to the third gate flexible circuit board 160 is applied to the gate control line 112 of the first substrate 110, and is applied to the fourth gate flexible circuit board through the gate control line 112. The fourth gate flexible circuit board 160 generates a remaining portion of the gate signals based on the gate control signal, and the remaining portion of the gate signals are applied to a remaining portion of the gate lines to control a remaining portion of the thin film transistors.

The gate control signal is applied to the first, second, third and fourth gate flexible circuit boards through the gate control line 112 of the first substrate 110, in sequence.

Figure 3:
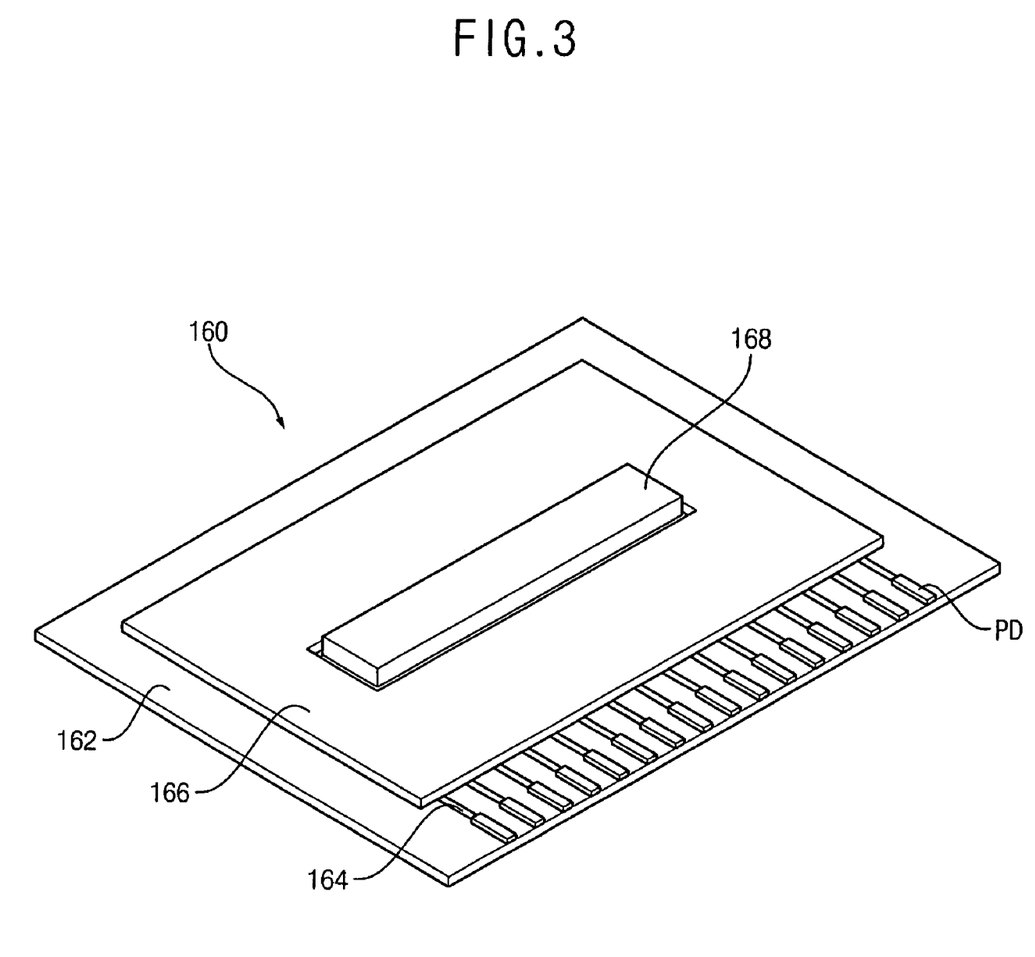
FIG. 3 is a perspective view illustrating an exemplary embodiment of a gate flexible circuit board of the display unit shown in FIG. 2.
Figure 4:
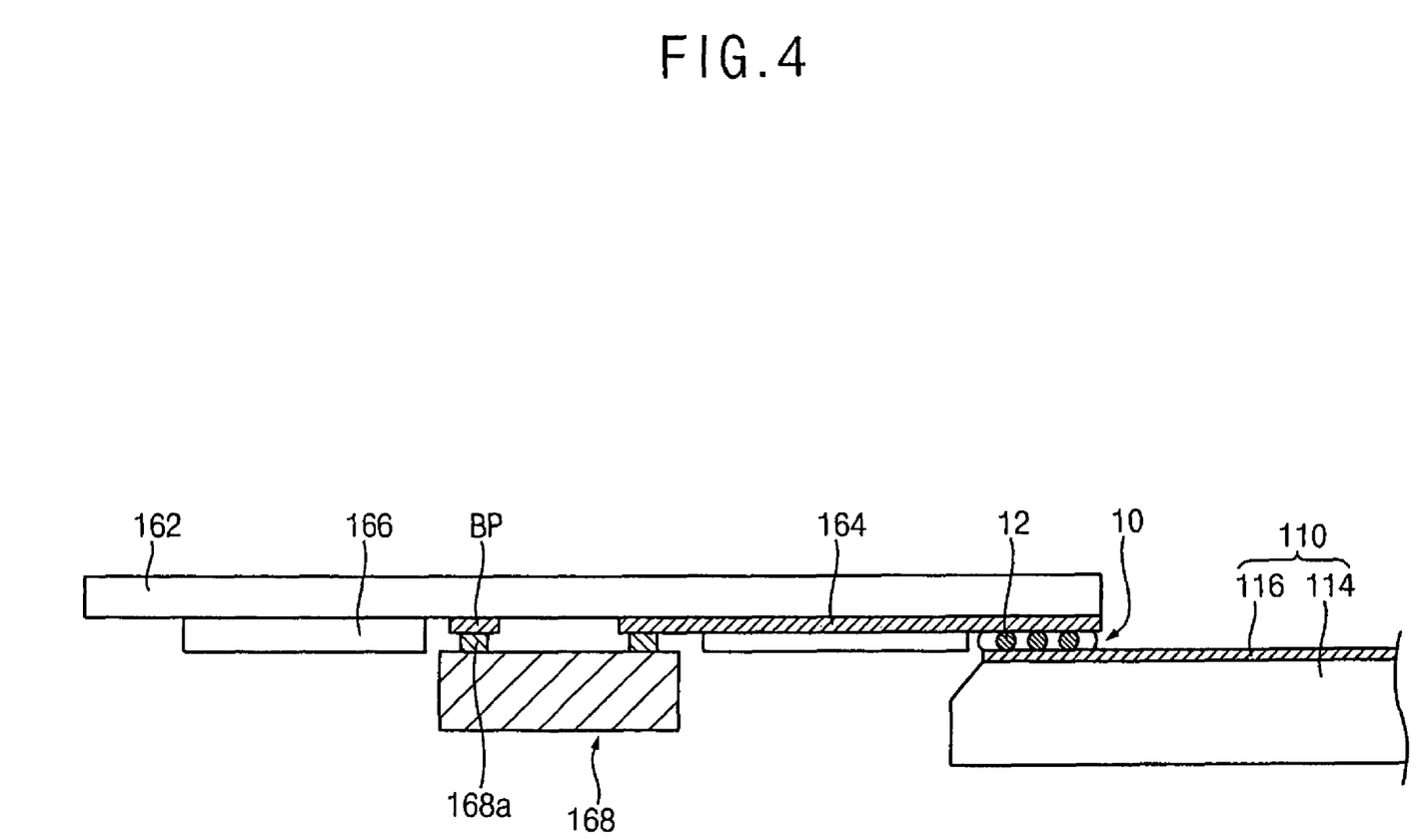
FIG. 4 is a cross-sectional view taken along line I-I' shown in FIG. 2.
Figure 5:
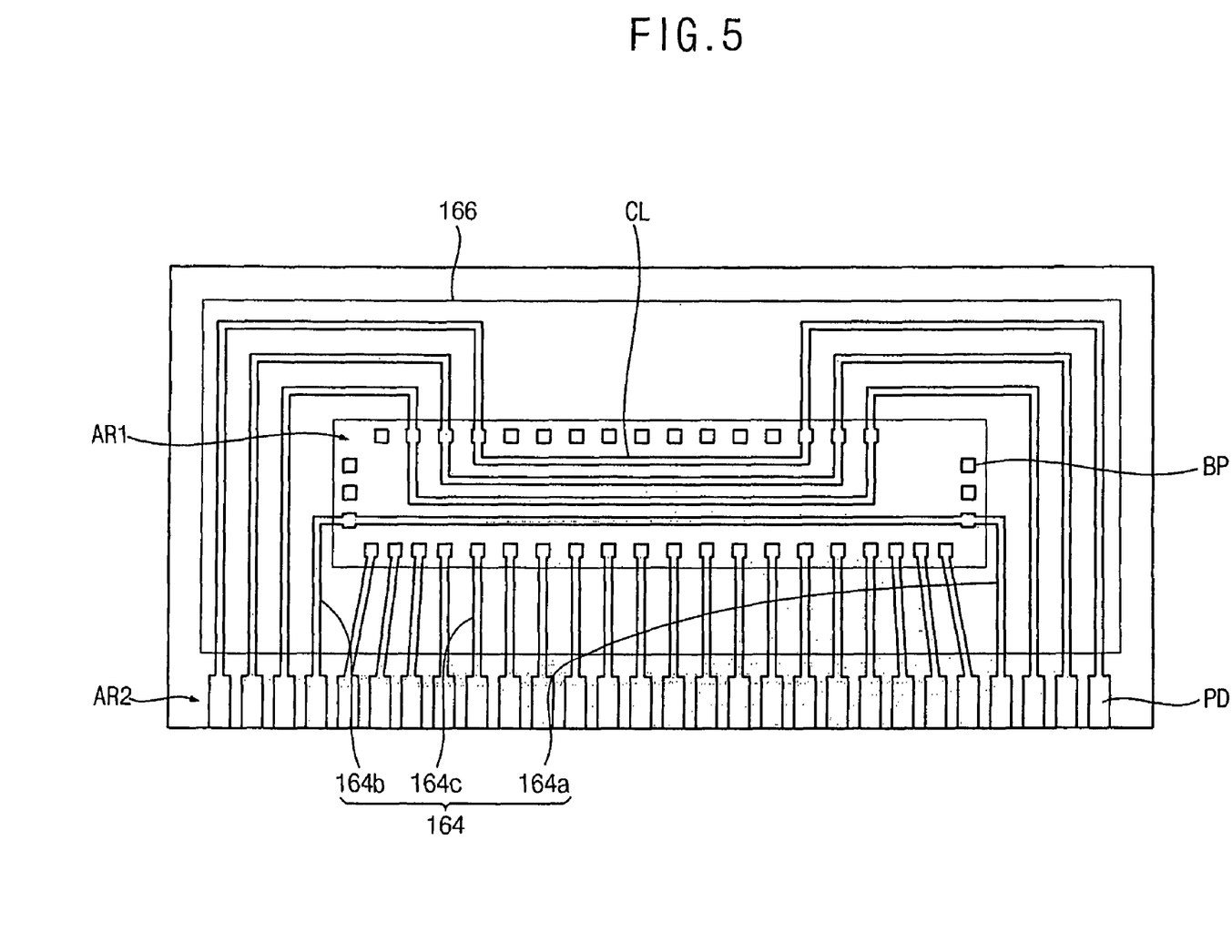
FIG. 5 is a plan view illustrating the gate flexible circuit board shown in FIG. 3 without a driving chip.

FIG. 3 is a perspective view illustrating an exemplary embodiment of a gate flexible circuit board of the display unit shown in FIG. 2. FIG. 4 is a cross-sectional view taken along line I-I' shown in FIG. 2. FIG. 5 is a plan view illustrating the gate flexible circuit board shown in FIG. 3 without a driving chip.

Referring to FIGS. 3 to 5, the gate flexible circuit board 160 includes a base layer (or film) 162, a transmission line 164, a protecting layer 166, a gate driving chip 168 and a connecting transmission line CL. The gate flexible circuit board 160 may further include a plurality of transmission lines 164.

In exemplary embodiments, the base film 162 may include a flexible synthetic resin film. In one exemplary embodiment, the base film 162 may have a substantially rectangular plate shape.

A plurality of the transmission lines 164 may be formed on the base film 162. A plurality of external pads PD may be formed on end portions of the transmission lines 164 so that the transmission lines 164 are electrically connected to lines of the first substrate 110. The external pads PD aligned substantially in parallel may be formed on the base film 162 facing the first substrate 110.

The transmission lines 164 are electrically connected to the lines of the first substrate 110 through an anisotropic conductive film 10 including conductive particles 12. In one exemplary embodiment, the external pads PD of the transmission lines 164 are electrically connected to a gate control line 112 and a plurality of gate lines 116. The gate control line 112 and the gate lines 116 may be formed on a transparent substrate 114 of the first substrate 110. In exemplary embodiments, an inclined portion may be formed on a side (or edge) of the first substrate 110.

The transmission lines 164 may include an input transmission line 164a, an output transmission line 164b and a gate transmission line 164c. The input transmission line 164a, the gate transmission line 164c and the output transmission line 164b are aligned substantially in parallel in a longitudinal direction of the gate flexible circuit board 160, in sequence.

As in the illustrated exemplary embodiment, the input transmission line 164a is adjacent to a first transverse side of the gate flexible circuit board 160. The gate transmission line 164c is on a substantially central portion of the gate flexible circuit board 160 along the longitudinal direction. The output transmission line 164b is adjacent to a second transverse side opposite to the first transverse side of the gate flexible circuit board 160. The input transmission line 164a, the gate transmission line 164c and the output transmission line 164b do not cross each other.

The input transmission line 164a is electrically connected to the gate control line 112 of the first substrate 110 to transmit the gate control signal from the gate control line 112. The output transmission line 164b is electrically connected to the gate control line 112 of the first substrate 110 to transmit the gate control signal from the gate control line 112. The gate transmission line 164c is electrically connected to the gate lines 116 of the first substrate 110 to transmit the gate signals to the gate lines 116.

The protecting layer 166 is on the base film (or substrate) 162 covering the transmission lines 164 and protecting the transmission lines 164. The protecting layer 166 includes an opening in a region corresponding to the gate driving chip 168 and the external pads PD. The gate driving chip 168 corresponds to a driving chip region AR1 and the external pads PD correspond to a connection region AR2 of the gate flexible circuit board 160. Alternatively, a sealing region, in which a sealant (not shown) for fixing the gate driving chip 168 to the base film 162 is formed, may be defined between the protecting layer 166 and the gate driving chip 168

An internal pad BP is formed in the driving chip region AR1 and fixes the gate driving chip 168 to the base substrate 162. As in the illustrated exemplary embodiment of FIG. 5, a plurality of internal pads BP is formed in the driving chip region AR1 of the base substrate 162. In one exemplary embodiment, the internal pads BP may be soldered to connecting terminals 168a of the gate driving chip 168 and fix the gate driving chip 168 to the base substrate 162.

In an exemplary embodiment, the internal pads BP include an input internal pad, an output internal pad and a gate internal pad. The internal pads BP may further include a dummy internal pad. The input internal pad is electrically connected to the input transmission line 164a. The output internal pad is electrically connected to the output transmission line 164b. The gate internal pad is electrically connected to the gate transmission line 164b. The dummy internal pad may not be electrically connected to the transmission lines 164.

The gate driving chip 168 is combined with the internal pads BP of the driving chip region AR1 by the connecting terminals 168a and is fixed to the base substrate 162. In one exemplary embodiment, the gate driving chip 168 may have a substantially rectangular parallelepiped shape and a size of the gate driving chip 168 may be about 16 millimeters (mm)×1 millimeter (mm).

In exemplary embodiments, the connecting terminals 168a of the gate driving chip 168 include an input terminal, an output terminal and a gate terminal. The connecting terminals 168a may further include a dummy terminal.

The input terminal of the driving chip 168 is soldered with the input internal pad to receive a gate control signal that is from the input transmission line 164a. The driving chip 168 generates gate signals based on the gate control signal.

The output terminal of the driving chip 168 is soldered with the output internal pad to output the gate control signal that is from the driving chip 168 to the output transmission line 164b.

The gate terminal of the driving chip 168 is soldered with the gate internal pad to output the gate signals to the gate transmission line 164c.

The dummy terminal of the driving chip 168 is soldered with the dummy internal pad so that the driving chip 168 is securely combined with the base substrate 162.

Referring again to FIG. 5, the input transmission line 164a is electrically connected to the output transmission line 164b through the connecting transmission line CL. In one exemplary embodiment, the connecting transmission line CL is in the driving chip region AR1 of the base substrate 162, and the input internal pad that is electrically connected to the input transmission line 164a is electrically connected to the output internal pad that is electrically connected to the output transmission line 164b through the connecting transmission line CL.

The connecting transmission line CL transmits the gate control signal that is from the input transmission line 164a to the output transmission line 164b. In an alternative exemplary embodiment, the gate control signal that is from the input transmission line 164a may be transmitted to the output transmission line 164b through an internal line of the driving chip 168.

In exemplary embodiments, a resistance of the connecting transmission line CL may be no more than about 1Ω. In one exemplary embodiment, the resistance of the connecting transmission line CL may be about 0.01Ω to about 1Ω. A plurality of the connecting transmission lines CL that do not cross with each other may be formed in the driving chip region AR1.

In FIG. 5, the connecting transmission line CL is formed on a substantially same surface of the base substrate 162 as the input transmission line 164a and the output transmission line 164b. In an alternative exemplary embodiment, the connecting transmission line CL may be formed on a rear surface (or opposite surface) of the base substrate 162, on which the input transmission line 164a and the output transmission line 164b is not formed. When the connecting transmission line CL is formed on the rear surface of the base substrate 162, the connecting transmission line CL may be electrically connected to the input transmission line 164a and the output transmission line 164b through a via hole (not shown) formed in the base substrate 162. In an alternative exemplary embodiment, the base substrate 162 may have a multi-layered structure, and the connecting transmission line CL may be formed on a different surface (or layer) from the input transmission line 164a and the output transmission line 164b.

Figure 6:
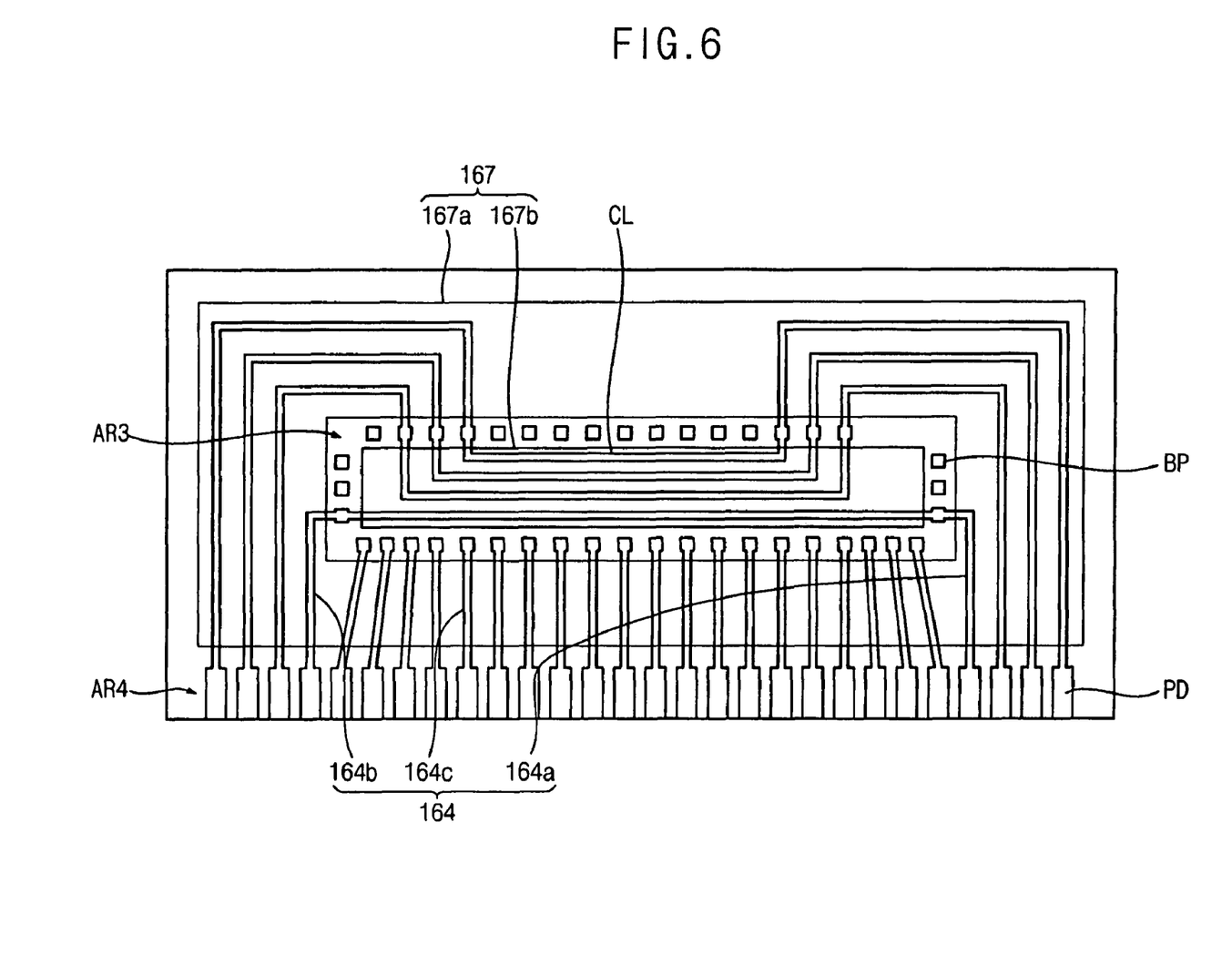
FIG. 6 is a plan view illustrating another exemplary embodiment of a gate flexible circuit board without a driving chip in accordance with the present invention.

FIG. 6 is a plan view illustrating another exemplary embodiment of a gate flexible circuit board without a driving chip in accordance with the present invention. The gate flexible circuit board of FIG. 6 is the same as in FIG. 5 except for a protecting layer. Thus, the same reference numerals will be used to refer to the same or like parts as those described in FIG. 5 and any further explanation concerning the above elements will be omitted.

Referring to FIG. 6, the protecting layer 167 covers an input transmission line 164a, an output transmission line 164b, a gate transmission line 164c and a connecting transmission line CL. The protecting layer 167 includes an opening in a bump region AR3 corresponding to an internal pad BP and a connection region AR4 corresponding to the external pads PD. The opening may be substantially frame shaped in a region where the protecting cover 167 does not cover the internal pads BP.

In FIG. 6, the protecting layer 167 covers the input transmission line 164a, the output transmission line 164b, the gate transmission line 164c and the connecting transmission line CL to decrease a noise formed by a gate control signal that is transmitted through the connecting transmission line CL.

Table 1 represents a relationship between a resistance of a gate flexible circuit board and a connecting transmission line.

| Resistance of Gate Flexible Circuit Board | Power Supply Signal | | | | Control Signal | | |
| --- | --- | --- | --- | --- | --- | --- | --- |
| | Vdd | Vss | Von | Voff | CPV | OE | STV |
| Without Connecting Transmission Line (Ω) | 10 | 10 | 10 | 10 | 26 | 26 | 26 |
| With Connecting Transmission Line (Ω) | ≦1 | ≦1 | ≦1 | ≦1 | ≦1 | ≦1 | ≦1 |

Referring to Table 1, the resistance of the gate flexible circuit board 160 having the connecting transmission line is compared with the resistance of the gate flexible circuit board 160 (shown in FIG. 3) without the connecting transmission line. The resistance corresponds to a gate control signal that passes through the gate flexible circuit board 160. The resistance is defined between two end portions of a gate flexible circuit board 160, which are electrically connected to each other by the connecting transmission line or an internal line of the driving chip.

The gate control signal includes a power supply signal to apply an electric power to the driving chip 168 (shown in FIG. 3) and a control signal to control the driving chip 168. The power supply signal includes first and second driving chip voltage signals Vdd and Vss to drive the driving chip 168, and first and second gate level signals Von and Voff to determine the amount of gate signals. The control signal includes a clock signal CPV to synchronize the gate signals, a gate start signal STV to initiate the gate signals, and a gate enable signal OE to remove a noise from the gate signals. The noise of the gate signals may be generated by overlapping adjacent gate signals.

Referring to table 1, when the gate flexible circuit board 160 does not include the connecting transmission line CL (shown in FIG. 5), the resistance of each of the first driving chip voltage signal Vdd, the second driving chip voltage signal Vss, the first gate level signal Von and the second gate level signal Voff is about 10Ω. However, when the gate flexible circuit board 160 includes the connecting transmission line, the resistance of each of the first driving chip voltage signal Vdd, the second driving chip voltage signal Vss, the first gate level signal Von and the second gate level signal Voff is no more than about 1Ω.

In addition, when the gate flexible circuit board 160 does not include the connecting transmission line CL, the resistance of each of the clock signal CPV, the gate start signal STV and the gate enable signal OE is about 26Ω. However, when the gate flexible circuit board 160 includes the connecting transmission line CL, the resistance of each of the clock signal CPV, the gate start signal STV and the gate enable signal OE is no more than about 1Ω. Thus, when the gate flexible circuit board 160 includes the connecting transmission line CL, the resistance of the gate flexible circuit board 160 is greatly decreased.

When the gate flexible circuit board does not include the connecting transmission line, the gate control signal is transmitted through the internal line of the driving chip so that the resistance of the gate flexible circuit board is increased.

However, when the gate flexible circuit board 160 includes the connecting transmission line CL, the gate control signal is transmitted through the connecting transmission line CL so that the resistance of the gate flexible circuit board is decreased.

In FIGS. 1 to 6, the connecting transmission line CL is formed in the driving chip region AR1 so that the input transmission line 164a is directly connected to the output transmission line 164*b* electrically. Advantageously, the resistance of the gate flexible circuit board 160 that transmits the gate control signal is greatly decreased and a delay of the gate control signal is reduced or effectively prevented.

In exemplary embodiments, the connecting transmission line having a lower resistance than the internal line of the driving chip is formed in the driving chip region such that the input transmission line is directly connected to the output transmission line electrically. Thus, the delay of the gate control signal is reduced or effectively prevented and image display quality is improved.

This invention has been described with reference to the exemplary embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. A flexible circuit board comprising:
   a base substrate;
   a driving chip disposed on a first surface of the base substrate;
   an input transmission line on the first surface of the base substrate and electrically connected to an input terminal of the driving chip;
   an output transmission line on the first surface of the base substrate and electrically connected to an output terminal of the driving chip; and
   a connecting transmission line through which the input transmission line is electrically connected to the output transmission line, the connecting transmission line being disposed in a region corresponding to the driving chip,
   wherein the connecting transmission line has a lower resistance than an internal line of the driving chip through which the input terminal of the driving chip is electrically connected to the output terminal of the driving chip.

2. The flexible circuit board of claim 1, wherein the connecting transmission line is on the first surface of the base substrate.

3. The flexible circuit board of claim 1, wherein the connecting transmission line is on a second surface of the base substrate opposite to the first surface.

4. The flexible circuit board of claim 1, further comprising a gate transmission line on the first surface of the base substrate and electrically connected to a gate terminal of the driving chip.

5. The flexible circuit board of claim 1, further comprising a protecting layer covering the input transmission line and the output transmission line and protecting the input transmission line and the output transmission line.

6. The flexible circuit board of claim 5, wherein the protecting layer includes an opening in a region corresponding to the driving chip.

7. The flexible circuit board of claim 1, further comprising an internal pad disposed on the first surface of the base substrate, the internal pad being soldered with a connecting terminal of the driving chip and fixing the driving chip to the first surface of the base substrate.

8. The flexible circuit board of claim 7, further comprising a protecting layer covering the input transmission line, the output transmission line and the connecting transmission line, the protecting layer including an opening in a region corresponding to the internal pad.

9. The flexible circuit board of claim 7, wherein the internal pad comprises:
   an input internal pad electrically connected to the input transmission line; and
   an output internal pad electrically connected to the output transmission line.

10. The flexible circuit board of claim 9, wherein the input internal pad is electrically connected to the output internal pad through the connecting transmission line.

11. The flexible circuit board of claim 1, wherein a resistance of the connecting transmission line is about $0.01\Omega$ to about $1\Omega$.

* * * * *